United States Patent
Kim et al.

(10) Patent No.: US 8,069,455 B2
(45) Date of Patent: Nov. 29, 2011

(54) OPTICAL DISK APPARATUS

(75) Inventors: Pyo Kim, Suwon-si (KR); Young-Sun Yoo, Suwon-si (KR); Dong-Woo Rhee, Suwon-si (KR); Sang-Kyu Lee, Suwon-si (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 806 days.

(21) Appl. No.: 12/073,713

(22) Filed: Mar. 7, 2008

(65) Prior Publication Data

US 2008/0250435 A1    Oct. 9, 2008

(30) Foreign Application Priority Data

Apr. 3, 2007 (KR) .......................... 10-2007-0032708

(51) Int. Cl.
*G11B 33/12* (2006.01)
(52) U.S. Cl. ..................... 720/652; 720/658; 720/685
(58) Field of Classification Search .................. 720/652, 720/658, 685
See application file for complete search history.

(56) References Cited

U.S. PATENT DOCUMENTS

| 5,404,239 A * | 4/1995 | Hirai ............................... 349/150 |
| 2005/0108876 A1 * | 5/2005 | Mathieu et al. .................. 29/854 |
| 2007/0253315 A1 * | 11/2007 | Yamada .......................... 369/266 |

* cited by examiner

*Primary Examiner* — Daniell L Negron
*Assistant Examiner* — Carlos E Garcia

(57) ABSTRACT

An optical disk apparatus is disclosed which includes a first printed circuit board, on which a first circuit pattern is formed; a rotor, on which an optical disk may be placed, and which is electrically connected with the first circuit pattern; a second printed circuit board, which is stacked adjacent to the rotor on a surface of the first printed circuit board, and on which a second circuit pattern is formed; a sensor unit, which is mounted on the second printed circuit board in electrical connection with the second circuit pattern, and which is configured to sense a rotation of the optical disk; and a support plate, which supports the first printed circuit board and the rotor. In this optical disk apparatus, a separate printed circuit board can be utilized to support the sensor unit, whereby manufacturing costs can be reduced and working efficiency can be improved.

4 Claims, 6 Drawing Sheets

OPTICAL DISK APPARATUS

CROSS-REFERENCE TO RELATED APPLICATIONS

This application claims the benefit of Korean Patent Application No. 10-2007-0032708 filed with the Korean Intellectual Property Office on Apr. 3, 2007, the disclosure of which is incorporated herein by reference in its entirety.

BACKGROUND

1. Technical Field

The present invention relates to an optical disk apparatus.

2. Description of the Related Art

The optical disk has established itself as the industry standard for data storage in the areas of computers, videos, and music. The various types of optical disks include CD's, DVD's, and disks for various game systems, where a commercially produced optical disk typically holds recorded digital data on one side and a printed visual label on the other.

While in some cases, an optical disk is manufactured that is capable of storing data on both sides, in the majority of cases, the other side of a disk is reserved for printed texts, patterns, or images, with the optical disk data stored on just one side of the disk. The label printed on the non-data side of the optical disk may include text that describes the data stored on the disk, or may provide a decorative design function.

The labeling on the disk, for most consumers, is typically performed by printing a separate adhesive label and attaching the label onto the non-data side of the disk, or by writing by hand directly on the disk, or by writing by hand on an attached label.

However, with the development label printing technology, techniques have been presented for directly printing a label onto the non-data side of the disk, using the laser of the optical disk drive.

FIG. 1 is a perspective view of an optical disk apparatus according to the related art, and FIG. 2 is a magnified perspective view of the holder in the optical disk apparatus shown in FIG. 1.

As illustrated in FIGS. 1 and 2, with the application of Light Scribe technology to the optical disk drive (ODD) for label printing, there has appeared a need to install a Light Scribe sensor (L/S sensor) 50, as a critical component, on the motor or the deck to control rotation.

For this, in the optical disk apparatus according to the related art, a socket type holder 40 is employed that is fabricated by a separate molding process. However, the method of using such socket type holder 40 requires solder terminals 42, not to mention the holder 40 itself, so that material costs may be increased and production efficiency may be decreased.

SUMMARY

An aspect of the invention is to provide an optical disk apparatus, in which the design and the height difference compensation for the optical sensor can be implemented in a simple and inexpensive manner.

One aspect of the invention provides an optical disk apparatus that includes a first printed circuit board, on which a first circuit pattern is formed; a rotor, on which an optical disk may be placed, and which is electrically connected with the first circuit pattern; a second printed circuit board, which is stacked adjacent to the rotor on a surface of the first printed circuit board, and on which a second circuit pattern is formed; a sensor unit, which is mounted on the second printed circuit board such that the sensor unit is in electrical connection with the second circuit pattern, and which is configured to sense a rotation of the optical disk; and a support plate, which supports the first printed circuit board and the rotor.

In certain embodiments of the invention, the optical disk apparatus may include a through-hole formed in the second printed circuit board, to electrically connect the first circuit pattern and the second circuit pattern, and/or may be equipped with a dummy terminal formed on the first printed circuit board to limit a movement of the second printed circuit board. There may also be a screw that penetrates and couples the first printed circuit board and the support plate, while also serving to ground the first circuit pattern.

A sum of thicknesses of the second printed circuit board and the sensor unit can be made to be in correspondence with a distance from the surface of the first printed circuit board to the optical disk.

Additional aspects and advantages of the present invention will be set forth in part in the description which follows, and in part will be obvious from the description, or may be learned by practice of the invention.

DETAILED DESCRIPTION

Figure 1:
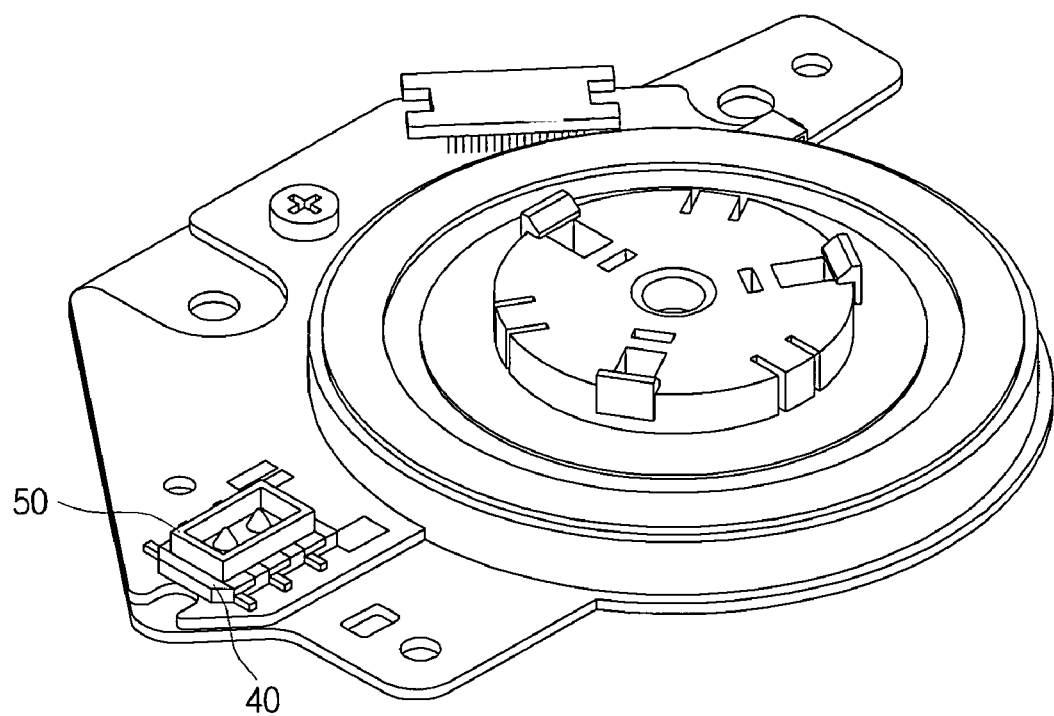
FIG. 1 is a perspective view of an optical disk apparatus according to the related art.
Figure 2:
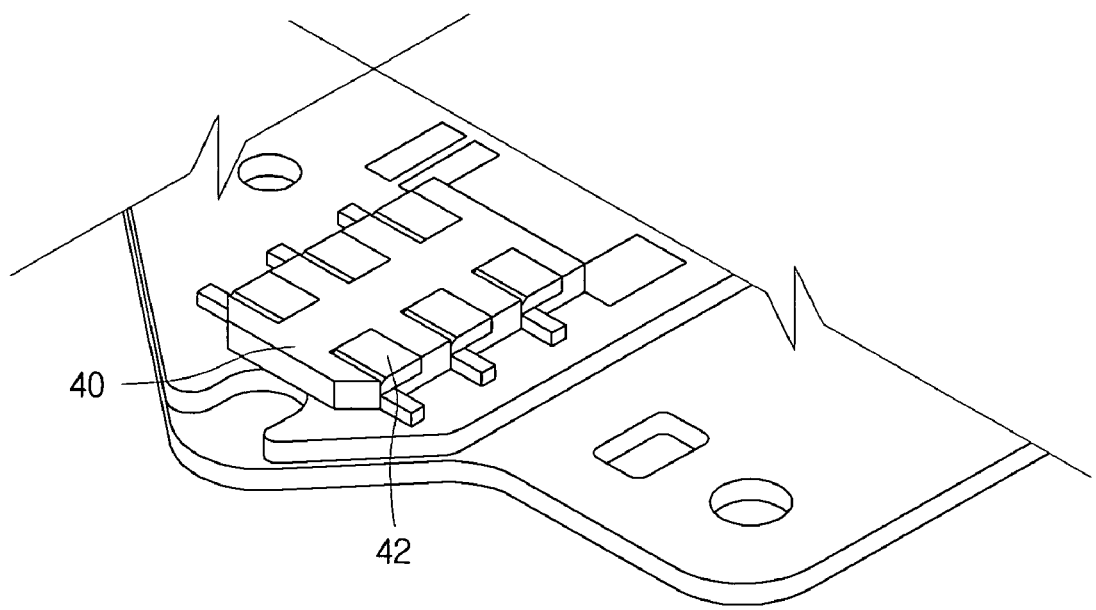
FIG. 2 is a magnified perspective view of a holder in the optical disk apparatus shown in FIG. 1.

The optical disk apparatus according to certain embodiments of the invention will be described below in more detail with reference to the accompanying drawings. Those components that are the same or are in correspondence are rendered the same reference numeral regardless of the figure number, and redundant explanations are omitted.

Figure 3:
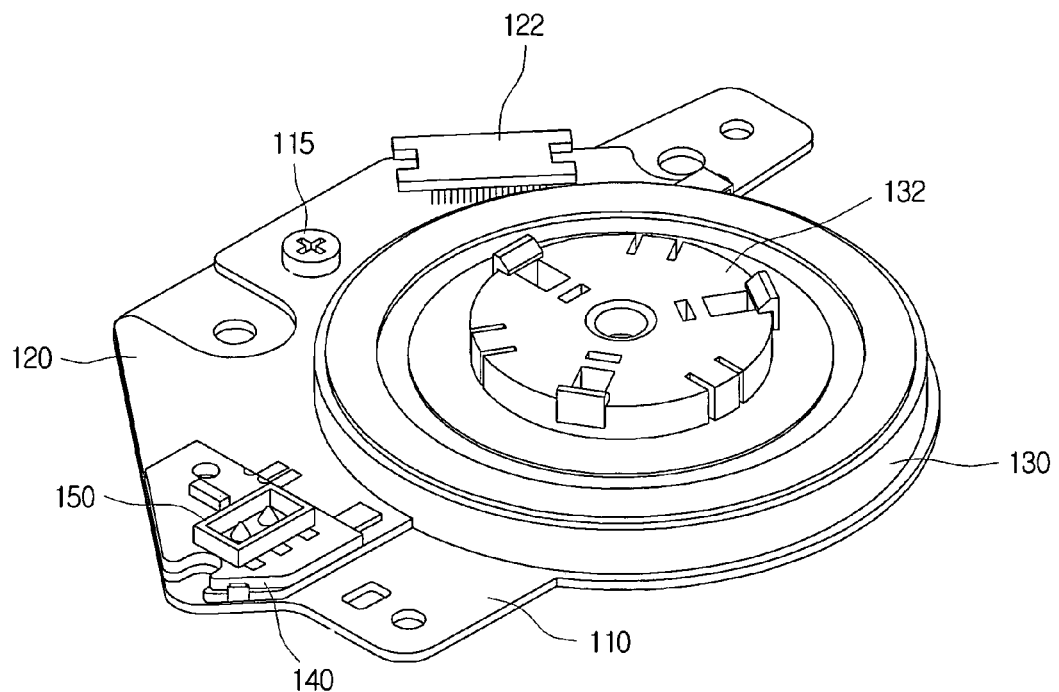
FIG. 3 is a perspective view of an optical disk apparatus according to an aspect of the present invention.
Figure 4:
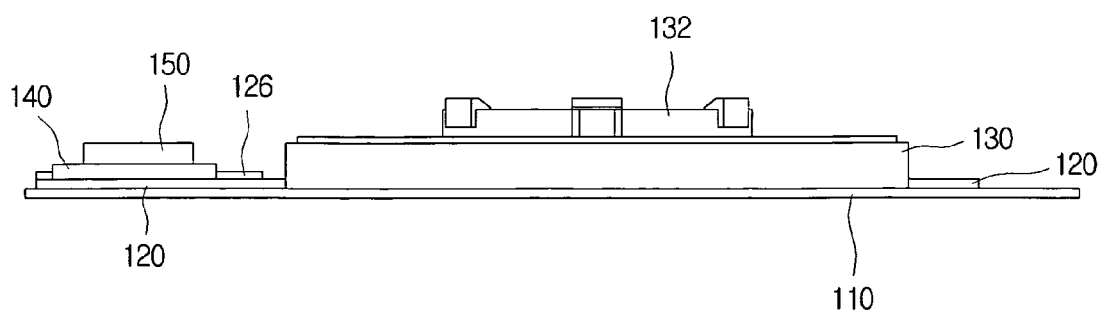
FIG. 4 is a front-elevational view of the optical disk apparatus shown in FIG. 3.
Figure 5:
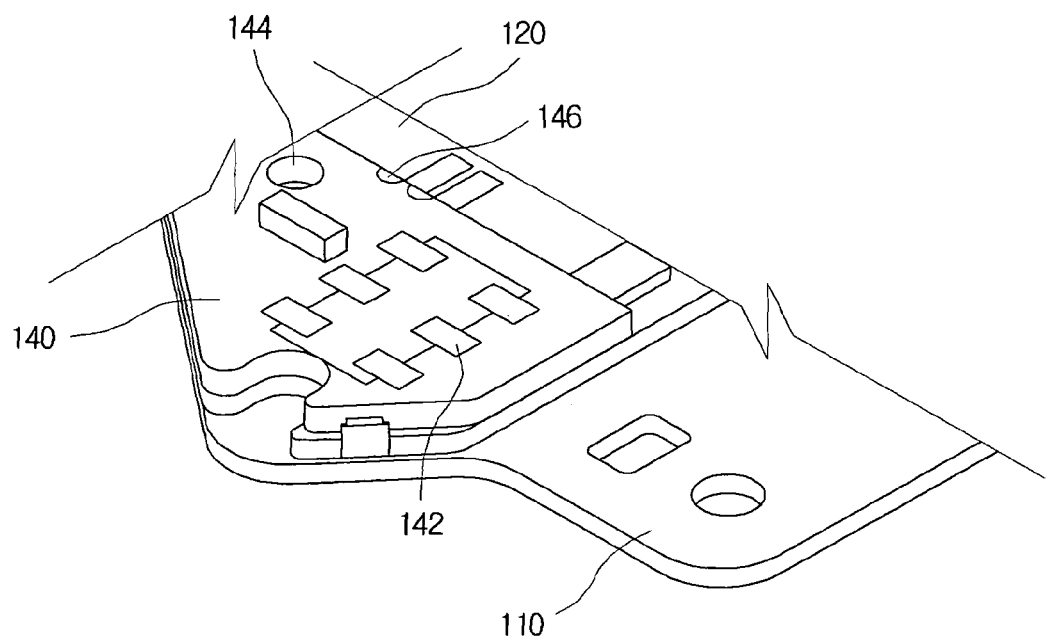
FIG. 5 and FIG. 6 are magnified perspective views of the second printed circuit board in the optical disk apparatus shown in FIG. 3.
Figure 6:
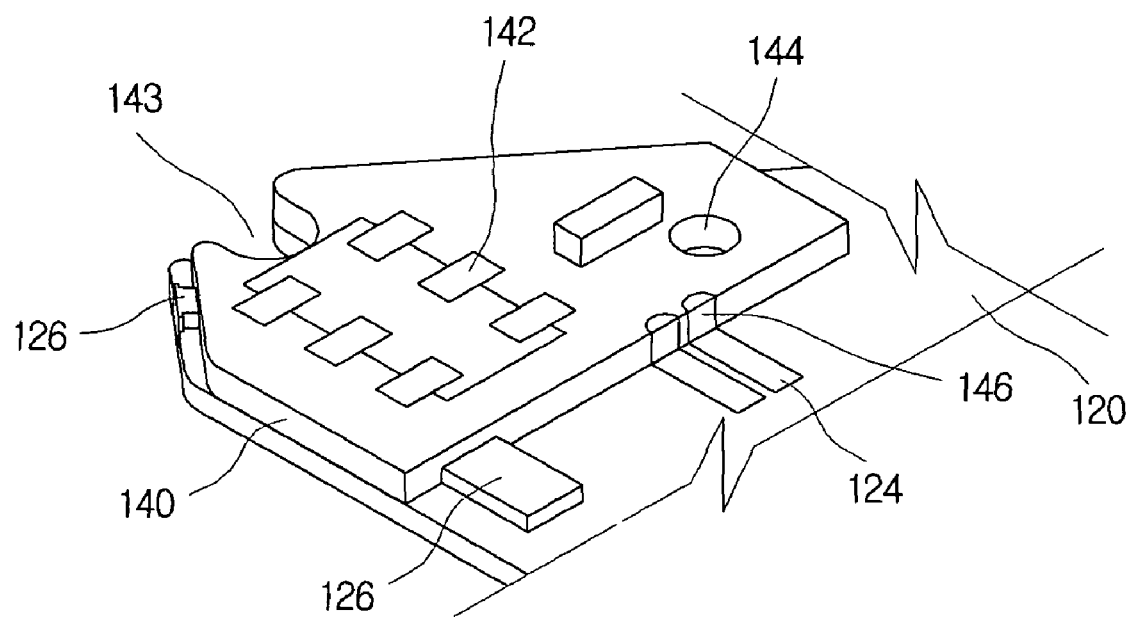

FIG. 3 is a perspective view of an optical disk apparatus according to an aspect of the present invention, FIG. 4 is a front-elevational view of the optical disk apparatus shown in FIG. 3, and FIG. 5 and FIG. 6 are magnified perspective views of the second printed circuit board in the optical disk apparatus shown in FIG. 3. In FIGS. 3 to 6 are illustrated a support plate 110, a screw 115, a first printed circuit board 120, an electronic component 122, power terminals 124, dummy terminals 126, a rotor 130, a protrusion 132, a second printed circuit board 140, pads 142, alignment indentations 143, 144, through-holes 146, and a sensor unit 150.

The support plate 110 may serve to support the printed circuit boards 120, 140 and the rotor 130, etc. The printed circuit board 120 and rotor 130, etc., may be coupled onto or placed on the support plate 110, to be supported by the support plate 110.

This support plate 110 can be made of a metal or a synthetic resin, etc., in consideration of its durability. If the support plate 110 is made of metal, the support plate 110 may also provide a grounding function for the circuit pattern (not shown) formed on the printed circuit board 120, and may efficiently serve as a heat-releasing plate as well.

The first printed circuit board 120 can be coupled to or placed on the support plate 110, to be supported by the support plate 110. A first circuit pattern (not shown) can be formed on the first printed circuit board 120 to perform a particular function. For example, the first circuit pattern may provide power that allows the rotor 130 to rotate, and/or may provide power via the power terminals 124 to allow the sensor unit 150 to operate. Furthermore, the first circuit pattern may also be electrically connected with a particular electronic component 122 mounted on the first printed circuit board 120 to allow various functions desired by the user.

The first printed circuit board 120 and the support plate 110 can be coupled by way of a screw 115 that penetrates the first printed circuit board 120 and support plate 110. Here, the screw 115 may electrically connect the first circuit pattern (not shown) with the support plate 110, for grounding the first circuit pattern (not shown).

The rotor 130 is the part that receives power and rotates. An optical disk (not shown) can be placed on the rotor 130 and can be rotated by the rotation of the rotor 130. In order that the optical disk (not shown) may be firmly secured, a protrusion 132 can be formed on a surface of the rotor 130.

A second printed circuit board 140 may be stacked on a surface of the first printed circuit board 120 adjacent to the rotor 130, where a sensor unit 150 may be mounted on the second printed circuit board 140 that senses the rotation of the optical disk (not shown).

The second printed circuit board 140 may serve as a holder that supports the sensor unit 150. That is, the socket type holder 40 used in an optical disk (not shown) according to the related art can be replaced by the second printed circuit board 140. The sensor unit 150 can be mounted on the second printed circuit board 140, and the sensor unit 150 can be electrically connected with a second circuit pattern (not shown) formed on the second printed circuit board 140, as well as with the first circuit pattern (not shown) via through-holes 146 that connect either side of the second printed circuit board 140. In this way, the sensor unit 150 can be supplied with power, and can also be made to transmit and receive signals. In FIG. 5 and FIG. 6, through-holes 146 are illustrated that are formed in positions adjacent to the perimeter of the second printed circuit board 140.

By thus using the printed circuit board to support the sensor unit 150, the need in the related art to fabricate a separate mold is eliminated, for reduced manufacture costs and enhanced workability. Using the printed circuit board also allows increased workability in mounting the sensor unit 150, where alignment indentations 143, 144 formed in the first printed circuit board 120 and second printed circuit board 140 can be used to readily determine the positions for assembly.

In order that the second printed circuit board 140 may firmly support the sensor unit 150, it can be desirable to have the second printed circuit board 140 itself be firmly supported by the first printed circuit board 120. For this, a dummy terminal 126 can be formed on the first printed circuit board 120, with the dummy terminal 126 made to limit the movement of the second printed circuit board 140. This dummy terminal 126 can be formed adjacent to the sides of the second printed circuit board 140, and multiple dummy terminals 126 can be arranged in suitable positions in consideration of the shape of the second printed circuit board 140.

The sensor unit 150 may be mounted on the second printed circuit board 140, and may sense the rotation of the optical disk (not shown) caused by the rotation of the rotor 130. The sensor unit 150 can include an optical sensor (not shown), for example. FIGS. 5 and 6 show pads 142 formed on the second printed circuit board 140 for mounting the sensor unit 150.

For more reliable sensing, the distance from the sensor unit 150 to the optical disk (not shown) can be adjusted according to the specifications of the optical sensor (not shown). To this end, the sum of the thicknesses of the second printed circuit board 140 and the sensor unit 150 can be adjusted to be in correspondence with the distance from the surface of the first printed circuit board 120 to the optical disk (not shown). That is, the distance between the optical sensor (not shown) and the optical disk (not shown) may be adjusted such that the optical sensor (not shown) provides optimal performance.

While this can be achieved by adjusting the thickness of the sensor unit 150, the effect of compensating height difference can be obtained in a simple and inexpensive manner by adjusting the thickness of the second printed circuit board 140.

Using the structure described above, the rotation of the optical disk (not shown) can be sensed and controlled, to enable the printing of a label, etc., onto the optical disk (not shown).

According to certain embodiments of the invention as set forth above, a separate printed circuit board can be utilized to support the sensor unit which senses the rotation of the optical disk, whereby manufacturing costs can be reduced and working efficiency can be improved.

While the spirit of the invention has been described in detail with reference to particular embodiments, the embodiments are for illustrative purposes only and do not limit the invention. It is to be appreciated that those skilled in the art can change or modify the embodiments without departing from the scope and spirit of the invention.

What is claimed is:

1. An optical disk apparatus comprising:
   a first printed circuit board having a first circuit pattern formed thereon;
   a rotor configured to have an optical disk placed thereon and electrically connected with the first circuit pattern;
   a second printed circuit board stacked adjacent to the rotor on a surface of the first printed circuit board and having a second circuit pattern and a through-hole formed thereon, the through-hole electrically connecting the first circuit pattern with the second circuit pattern;
   a sensor unit mounted on the second printed circuit board in electrical connection with the second circuit pattern and configured to sense a rotation of the optical disk; and
   a support plate supporting the first printed circuit board and the rotor,
   wherein the second circuit pattern is formed on an upper surface of the second printed circuit board and is electrically connected with the sensor unit directly, and
   wherein the second printed circuit board is placed on an upper surface of the first printed circuit board, and the through-hole penetrating through the second printed circuit board directly connects the first circuit pattern with the second circuit pattern.

2. The optical disk apparatus of claim 1, further comprising a dummy terminal formed on the first printed circuit board to limit a movement of the second printed circuit board.

3. The optical disk apparatus of claim 1, further comprising a screw penetrating and coupling the first printed circuit board and the support plate, the screw configured to ground the first circuit pattern.

4. The optical disk apparatus of claim 1, wherein a sum of thicknesses of the second printed circuit board and the sensor unit is in correspondence with a distance from the surface of the first printed circuit board to the optical disk.

* * * * *